United States Patent
Narendrnath

(10) Patent No.: US 10,636,690 B2
(45) Date of Patent: Apr. 28, 2020

(54) LAMINATED TOP PLATE OF A WORKPIECE CARRIER IN MICROMECHANICAL AND SEMICONDUCTOR PROCESSING

(71) Applicant: APPLIED MATERIALS, INC., Santa Clara, CA (US)

(72) Inventor: Kadthala R. Narendrnath, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 654 days.

(21) Appl. No.: 15/356,905

(22) Filed: Nov. 21, 2016

(65) Prior Publication Data

US 2018/0025932 A1 Jan. 25, 2018

Related U.S. Application Data

(60) Provisional application No. 62/364,590, filed on Jul. 20, 2016.

(51) Int. Cl.
| | |
|---|---|
| *H01L 21/683* | (2006.01) |
| *H01L 21/687* | (2006.01) |
| *H05B 3/28* | (2006.01) |
| *H05B 3/14* | (2006.01) |

(52) U.S. Cl.
CPC ...... *H01L 21/6833* (2013.01); *H01L 21/6831* (2013.01); *H01L 21/68757* (2013.01); *H05B 3/143* (2013.01); *H05B 3/283* (2013.01); *H05B 2203/017* (2013.01)

(58) Field of Classification Search
None
See application file for complete search history.

(56) References Cited

U.S. PATENT DOCUMENTS

| | | | |
|---|---|---|---|
| 4,799,983 A | 1/1989 | Desai | |
| 5,240,671 A | 8/1993 | Carey | |
| 6,507,006 B1 * | 1/2003 | Hiramatsu | H01L 21/67103 219/444.1 |
| 6,639,783 B1 * | 10/2003 | Shamouilian | H02N 13/00 279/128 |
| 6,690,583 B1 * | 2/2004 | Bergstedt | H01L 21/4807 257/E21.505 |

(Continued)

FOREIGN PATENT DOCUMENTS

EP 1186033 B1 1/2009

OTHER PUBLICATIONS

International Preliminary Report on Patentability from PCT/US2017/033166 dated Jan. 31, 2019, 11 pgs.

(Continued)

*Primary Examiner* — Joseph M Pelham
(74) *Attorney, Agent, or Firm* — Schwabe, Williamson & Wyatt, P.C.

(57) ABSTRACT

A laminated top plate of a workpiece carrier is described that is particularly suitable for mechanical and semiconductor processing. In one example, A method of fabricating a workpiece carrier top plate includes dispensing conductive paste onto at least one of a plurality of ceramic sheets, embedding the paste between the plurality of ceramic sheets, compacting ceramic sheets together with the paste, and sintering the paste.

18 Claims, 5 Drawing Sheets

(56) References Cited

U.S. PATENT DOCUMENTS

| | | | |
|---|---|---|---|
| 6,929,874 B2* | 8/2005 | Hiramatsu | B32B 18/00 219/544 |
| 2003/0015515 A1* | 1/2003 | Ito | H01L 21/67103 219/444.1 |
| 2003/0098299 A1* | 5/2003 | Hiramatsu | C04B 38/0054 219/444.1 |
| 2003/0132217 A1* | 7/2003 | Ito | H01L 21/6831 219/444.1 |
| 2003/0201264 A1* | 10/2003 | Kuibira | H01L 21/67103 219/444.1 |
| 2003/0222343 A1 | 12/2003 | Sakaida | |
| 2004/0026403 A1* | 2/2004 | Kariya | H01L 21/67103 219/444.1 |
| 2004/0134899 A1* | 7/2004 | Hiramatsu | H01L 21/6732 219/544 |
| 2004/0140040 A1* | 7/2004 | Hiramatsu | H01L 21/67103 156/89.12 |
| 2004/0222211 A1* | 11/2004 | Hiramatsu | C04B 35/581 219/444.1 |
| 2004/0244695 A1* | 12/2004 | Hashikura | C23C 16/4581 118/728 |
| 2005/0028739 A1* | 2/2005 | Natsuhara | C23C 16/4581 118/728 |
| 2005/0029244 A1* | 2/2005 | Ito | C04B 35/00 219/444.1 |
| 2005/0045618 A1* | 3/2005 | Ito | B32B 18/00 219/444.1 |
| 2005/0242078 A1* | 11/2005 | Kuibira | H01L 21/67103 219/444.1 |
| 2007/0056953 A1* | 3/2007 | Awazu | H01L 21/67109 219/444.1 |
| 2012/0250212 A1 | 10/2012 | Kimura et al. | |
| 2013/0319762 A1* | 12/2013 | Harris | H01L 21/67103 174/94 R |
| 2014/0356637 A1 | 12/2014 | Lee | |
| 2015/0226611 A1 | 8/2015 | Busche et al. | |
| 2015/0348813 A1 | 12/2015 | Mangalore et al. | |
| 2016/0099163 A1 | 4/2016 | Nasu et al. | |
| 2016/0111314 A1 | 4/2016 | Kimball et al. | |
| 2016/0126125 A1* | 5/2016 | Okugawa | H01L 21/67103 219/444.1 |
| 2016/0198524 A1 | 7/2016 | Pease et al. | |
| 2017/0057880 A1* | 3/2017 | Ahrendes | B32B 18/00 |
| 2017/0251524 A1* | 8/2017 | Atsuji | H05B 1/0233 |

OTHER PUBLICATIONS

Xuechuan Shan, et al., "Micro Embossing of Ceramic Green Substrates for Micro Devices," DTIP, Apr. 2008, 5 pages.

Zongrong Liu, et al., "Development of Glass-Free Metal Electrically Conductive Thick Films," Mar. 2001, pp. 64-69, vol. 123, Journal of Electronic Packaging.

Mark Eblen, "Thermal Conductivity of Thick Film Tungsten Metallization used in High-Alumina Ceramic Microelectronic Packages," 15 pages, Kyocera America, Inc., San Diego, California.

International Search Report and Written Opinion from PCT/US2017/033166 dated Aug. 28, 2017, 14 pgs.

* cited by examiner

LAMINATED TOP PLATE OF A WORKPIECE CARRIER IN MICROMECHANICAL AND SEMICONDUCTOR PROCESSING

CROSS-REFERENCE TO RELATED APPLICATIONS

This application claims priority to U.S. Provisional Application Ser. No. 62/364,590, filed Jul. 20, 2016, entitled LAMINATED TOP PLATE OF A WORKPIECE CARRIER IN MECHANICAL AND SEMICONDUCTOR PROCESSING by Kadthala R. Narendrnath.

FIELD

The present description pertains to workpiece carriers for use in micromechanical and semiconductor processing and in particular a top plate of laminated ceramic sheets with embedded conductive paste.

BACKGROUND

In the manufacture of semiconductor chips, a workpiece, such as a silicon wafer or other substrate is exposed to a variety of different processes in different processing chambers. The chambers may expose the wafer to a number of different chemical and physical processes whereby minute integrated circuits and micromechanical structures are created on the substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates may be silicon, gallium arsenide, indium phosphide, glass, or other appropriate materials.

The processing chambers used in these processes typically include a substrate support, pedestal, or chuck to support the substrate during processing. In some processes, the pedestal may include an embedded heater to control the temperature of the substrate and, in some cases, to provide elevated temperatures that may be used in the process. An electrostatic chuck (ESC) has one or more embedded conductive electrodes to generate an electric field that holds the wafer on the chuck using static electricity.

An ESC will have a top plate, referred to as a puck, a bottom plate or base, referred to as a pedestal, and an interface or bond to hold the two together. The top surface of the puck has a contact surface that holds the workpiece which can be made of various materials, e.g. polymers, ceramic, or a combination, and may have coatings all over or over selective locations, etc. A variety of components are embedded into the puck including electrical components for holding or chucking the wafer, and thermal components for heating the wafer.

Because the circuits and structures formed on the workpiece are very small, the thermal and electrical environment provided by the workpiece support must be very precise. When the temperature is not uniform or consistent across the workpiece, the circuits and structures will have variations. If one support is different from another support, then the circuits and structures will vary with different supports. For extreme cases, the processes may require adjustment for use with different supports. This directly affects the quality and yield of the circuits and structures produced on the workpieces. As a result, a puck with embedded, thermal and electrical components has stringent dimensional requirements, both in-plane and vertical, to ensure consistent performance not only across the surface of a particular ESC but also from one ESC to another ESC.

SUMMARY

A laminated top plate of a workpiece carrier is described that is particularly suitable for mechanical and semiconductor processing. In one example, a method of fabricating a workpiece carrier top plate includes dispensing conductive paste onto at least one of a plurality of ceramic sheets, embedding the paste between the plurality of ceramic sheets, compacting ceramic sheets together with the paste, and sintering the paste.

BRIEF DESCRIPTION OF THE DRAWINGS

Embodiments of the present invention are illustrated by way of example, and not limitation, in the figures of the accompanying drawings in which.

DETAILED DESCRIPTION

As described herein, a top plate can be made for a chuck, pedestal, or carrier that supports a workpiece in a carrier. The top plate may be formed of ceramic with embedded electrical components and provide very high accuracy in the shape and the size of the embedded components. This provides better control over process parameters on the workpiece. The components are also more consistent from top plate to top plate. This provides more consistent production results as the top plates wear out and are replaced. As a result, smaller and more accurate features may be formed on the workpiece with higher quality and uniformity, reducing cost, increasing production quantities, and reducing down time for adjusting production parameters.

As described, a top plate may have electrical components that are formed by embossing or by stencils. These processes are able to produce pattern line dimensions with enhanced precision and consistency, lowering variations between different locations in an ESC, and from one ESC to another ESC.

Figure 1:
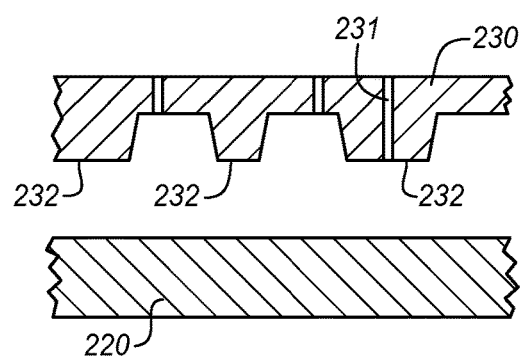
FIG. 1 is a cross-sectional side view diagram of a die and a ceramic green sheet positioned for embossing in accordance with an embodiment of the invention.

FIGS. 1-4 are cross-sectional side view diagrams of producing a portion of a top plate of an electrostatic chuck (ESC), a carrier, or a pedestal using an embossing process. In FIG. 1, a ceramic green sheet 220 is positioned for embossing. The ceramic green sheet may be formed in any of a variety of different ways. In some embodiments, 90-96% ceramic powder, e.g. of $Al_2O_3$ or AlN and glass, is compacted with a binder, e.g. plasticizers, at high pressure and then briefly sintered to form a pliable material that can be handled at room temperature and then hardened later by sintering. The green sheets may be from 0.05 mm to 0.5 mm thick and carried in a stainless steel frame for handling purposes.

Alternatively a green body or any other pliable ceramic material may be used. A green body in some examples is a monolithic compacted block of ceramic powder and binder with other fillers, After forming as described below it may be sintered in a furnace under heat and pressure. Such a process may also be applied to the green sheets as mentioned below.

An embossing die 230 is prepared that is wear-resistant, highly planar, and smooth with a line pattern precisely fabricated on one of its faces. Since the ceramic green sheet, green body or other material 220 is soft, the embossing die may be made of any suitable hard material such as metal, alloy or ceramic that can easily be machined to have the desired line pattern. The line pattern is a negative of the final pattern on the ceramic green sheet. The die faces are also preferably highly parallel. The die may have features such as air vents 231 to release any and all trapped air during the embossing process so that the embossed pattern on the ceramic green sheet meets the dimensional specification of the final pattern.

All the depressions in the final pattern show up as raised areas of identical dimensions with high fidelity on the die. The illustrated line pattern includes a ridge 232 for a later heater element or other electrical component. The ridge may correspond to an electrical feature or an elongated feature for an electrical connection to another component. There may be other features for other purposes, depending on the particular design. While only a few features are shown, there may be many more and they more correspond to many other features for electrical parts, for connections, to route cooling air and for other purposes.

The features 232 may optionally all have tapered sides or side walls as shown so that the base of each feature is wider than the surface that is pressed into the ceramic. This makes it easier to remove the die after embossing. It also results in channels 236 with tapered sides that are narrower at the bottom than at the top. The tapered channels are more easily filled by a dispenser without leaving air pockets at the bottom.

Figure 2:
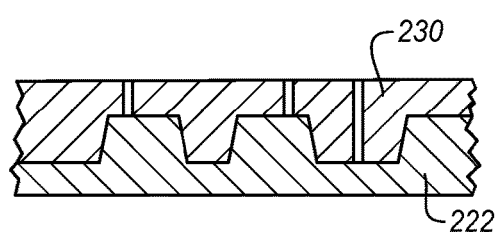
FIG. 2 is a cross-sectional side view diagram of the die pressed into the ceramic green sheet to emboss a heater channel and other features in accordance with an embodiment of the invention.

The embossing process may be performed with several operations as shown starting in FIG. 2. First, the ceramic green sheet is placed on a planar surface. Second the precision die is attached to a press so that the desired pattern is facing the green sheet.

Third, the ceramic green sheet is pressed into the die, or as shown the die is pressed into the ceramic green sheet as in FIG. 2, Pressure is applied uniformly to the two parts so that the die pattern is embossed on the ceramic green sheet 222 with high fidelity and precision. Air between the two is released through the vents 231 and the pressure is enough to emboss the pattern into the ceramic green sheet 222.

Figure 3:
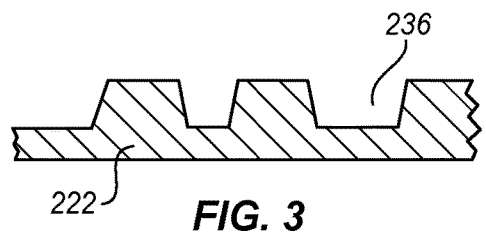
FIG. 3 is a cross-sectional side view diagram of an embossed heater channel in the ceramic green sheet in accordance with an embodiment of the invention.

Fourth, after embossing, the ceramic green sheet is removed from the die so that the embossed pattern from the die remains intact. Depending on the configuration of the press, the ceramic green sheet may alternatively remain in place when the die is removed from it. A surface preparation may be applied to the die before pressing to ease removal. The result is shown in FIG. 3 in which the features have been pressed into the green sheet. Each of the die features is now present on the ceramic green sheet including a channel 236 corresponding to the heater element ridge 232 of the die.

Figure 4:
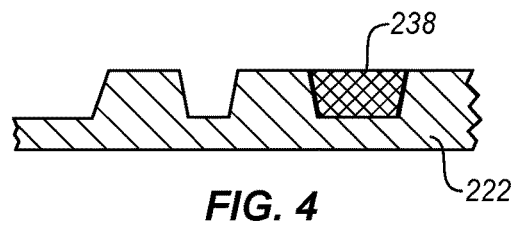
FIG. 4 is a cross-sectional side view diagram of an embossed ceramic green sheet with conductive paste dispensed into the heater channel in accordance with an embodiment of the invention.

Fifth, after separating the die, a precise amount of paste 238 is dispensed into the heater channel 236 as shown in FIG. 4. This may be done with an automatic paste dispenser that has a higher precision than the size of the channel. The dispenser may be programmed with the pattern of the features or channels 236 so that it dispenses the paste only in the channels. Different pastes may be dispensed into different channels to form different types of electrical components. The paste is used to form embedded conductive components. The paste contains a suitable conductive material such as a metal like tungsten, molybdenum, zinc, silver, gold, or a suitable refractory material in a powder, for example, and carried in a suitable suspension and dispersant.

Sixth, the green sheet with the embossed pattern filled with the conductive material is preferably de-aerated in a vacuum environment to remove any trapped air. After de-aeration, the vacuum chamber is vented, air pressure is applied to ensure that the conducting compound or paste 238 is sufficiently leveled and compacted within the embossed pattern. This process can be done at ambient or any other suitable temperature.

Seventh, the paste is dried so that it stays in place and is then inspected. After passing inspection the green sheet and paste is routed to the next steps in production process. In some embodiments, multiple green sheets, including any conductive paste are stacked. The stacked green sheets are pressed together with sufficient pressure to form a single, stable structure. The paste is dried to be hard enough to undergo the stacking and the compaction without too much deformation. The lamination of individual ceramic green sheets with the desired thermal and electrical components is then sintered to consolidate the separate sheets into a single solid entity. This is later converted to the final top plate or puck using additional finishing processes such as machining, grinding, polishing, grit blasting, cleaning, etc. Because metal or refractory materials may be dispensed on to intermediate sheets, these features can be embedded within the resulting structure after the sheets are pressed together.

Figure 5:
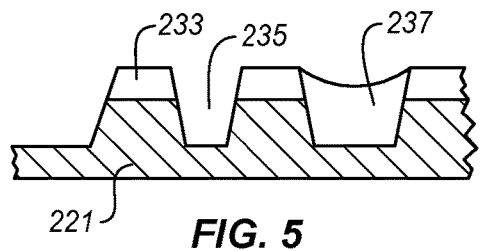
FIG. 5 is a cross-sectional side view diagram of a stencil applied over an embossed ceramic green sheet and a paste applied through the stencil in accordance with an embodiment of the invention.
Figure 6:
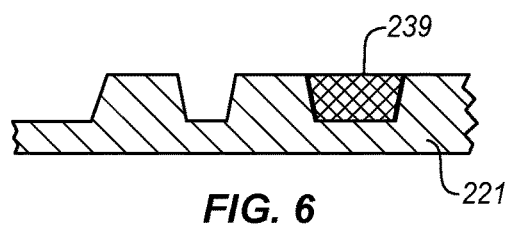
FIG. 6 is a cross-sectional side view diagram of the embossed ceramic green sheet after the applied paste has been leveled and dried in accordance with an embodiment of the invention.

FIGS. 5 and 6 are cross-sectional side view diagrams of a modification of the process of applying the paste as in FIG. 4. In FIG. 5 a substrate 221, such as a green sheet or green body has been embossed with a form as in the example of FIG. 2. A stencil 233 is applied over the green sheet. The stencil may be cut to shape and then placed over the green sheet or a solid sheet may be placed over the green sheet after the green sheet is embossed. The stencil may be cut using a laser or blade on an X-Y carriage to match the shape of the embossed features 235. The stencil may be made of a polymer or metal. A suitably durable stencil may be reused for many green sheets of the same design.

The paste 237 is applied into the embossed features using a precision dispenser with an X-Y carriage as discussed above or it may be applied using the squeegee technique described in more detail below. In some embodiments, the paste is a viscous fluid and therefore flows and responds to surface tension. The paste also shrinks when it dries. As shown in FIG. 5 when the paste is applied into the wells, it may form a Meniscus curve due to the surface tension on the sides of the wells. As a result, the wells are not completely filled and the paste does not form a flat surface, Using the stencil, the paste extends to the top of the stencil above the top of the green sheet.

FIG. 6 shows that after the paste has at least partially dried, the paste will shrink, and the stencil 233 may then be removed. The self-leveling paste deprived of the surface tension with the stencil will level and shrink forming a level top surface 239 after the paste is finally dried, cured, sintered or otherwise treated.

Figure 7:
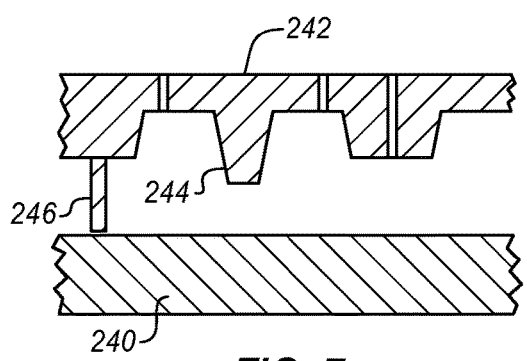
FIG. 7 is a cross-sectional side view diagram of an alternative die with a pin and a ceramic green sheet positioned for embossing in accordance with an embodiment of the invention.
Figure 8:
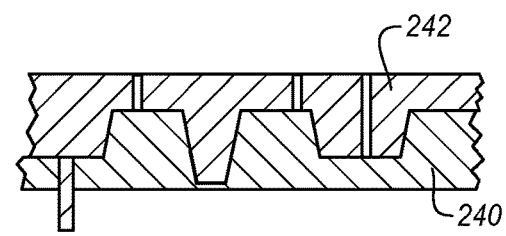
FIG. 8 is a cross-sectional side view diagram of the alternative die with the pin pressed into the ceramic green sheet to emboss a heater channel and other features in accordance with an embodiment of the invention.
Figure 9:
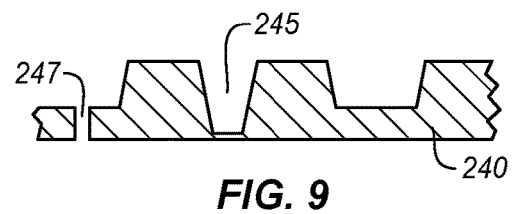
FIG. 9 is a cross-sectional side view diagram of an embossed hole and heater channel in the ceramic green sheet in accordance with an embodiment of the invention.

FIGS. 7-9 are cross-sectional side view diagrams of embossing a green sheet showing additional features on a die 242. In this example, the die includes pins 246 that pierce through one or more green sheets to form holes. In addition, some of the ridges of the die may have different sizes. In the diagram there is a single ridge 244 that is longer than the others. The widths and depths of the ridges may be adapted to provide different sized wells.

In FIG. 8, the die 242 is pressed into the green sheet 240. In FIG. 9, the die is removed leaving a green sheet 240 with one or more through holes 247 and a deeper well 245. The through holes may be used for back side gas, for lift pins, electrical terminals, or for any other desired purpose.

The wells may be made different sizes so that the final dried metal paste is formed into heater elements of different sizes. In general a larger heater element formed from a deeper well will generate more heat than a smaller heater element. By using different sizes of ridges, the final top plate may be tuned to produce more heat in some areas and less heat in other areas. The depths of the ridges may be varied continuously or in discrete steps.

The various dimensions of the die may be adapted for a green body, in any way necessary, for example, by making the pin 246 a suitable length for piercing the desired distance into or through the green sheet or green body. In the same way that a green body may be used, multiple green sheets may be stacked up together to form the substrate 220, 240, 221. By embossing multiple sheets, deeper wells 236, 245, 246 may be formed. In addition a hole 247 may be pierced through multiple green sheets at the same time.

Figure 10:
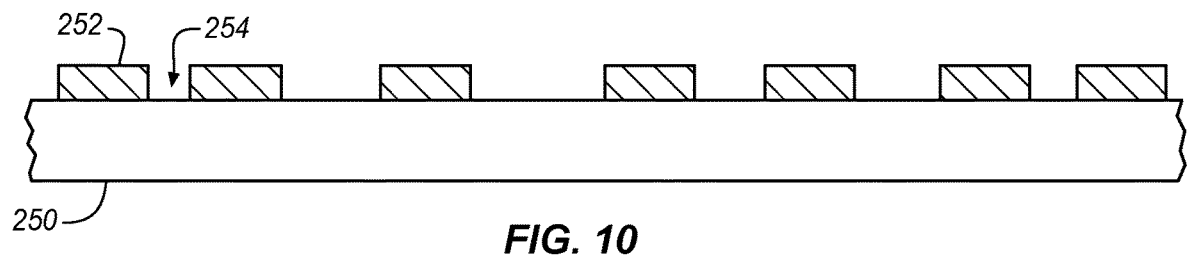
FIG. 10 is a cross-sectional side view diagram of a stencil on a ceramic green sheet according to an embodiment.
Figure 11:
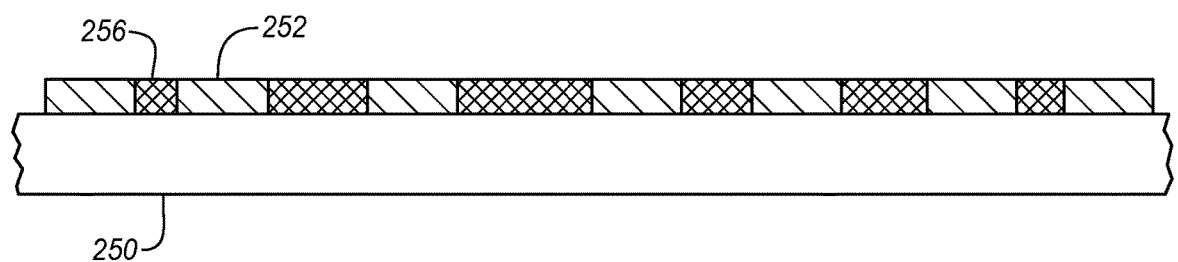
FIG. 11 is a cross-sectional side view diagram of the stencil on the ceramic green sheet with paste dispensed onto the green sheet through the stencil according to an embodiment.
Figure 12:
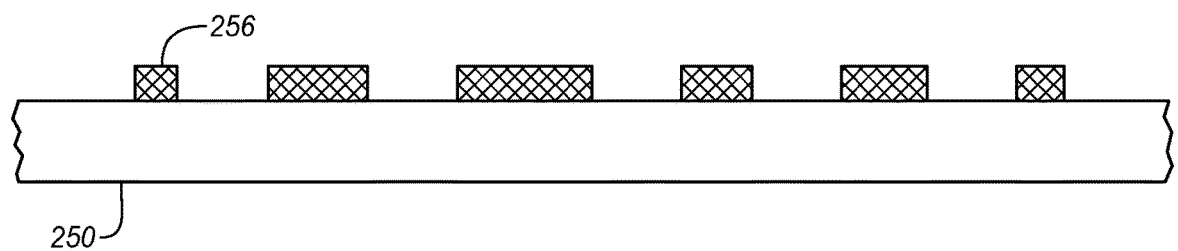
FIG. 12 is a cross-sectional side view diagram of the ceramic green sheet with the paste after the stencil has been removed according to an embodiment.

FIGS. 10-12 are cross-sectional side view diagrams of producing a portion of a top plate using a stencil process. In FIG. 10, a precision thickness polymeric stencil 252 with the desired electrical pattern is precisely aligned and laminated on a ceramic green body 250 ensuring no trapped air. Alternatively, the stencil may be metal, ceramic or any other material that provides a smooth surface and is able to withstand the temperature required to dry the paste. The stencil defines a line pattern of openings 254 through which the ceramic green sheet 250 is exposed. These opening allow paste to be dispensed onto the green sheet.

In some embodiments, the stencil is made of soft, thick polymer material that is laser cut to a high precision and replaced after each use. In some embodiments, the stencil is formed of a durable material, such as steel or aluminum that is laser cut or precisely stamped and is reused to make multiple ceramic sheets. In some embodiments, the stencil is placed onto the ceramic sheet as a plain stencil sheet that is first laminated on the ceramic green sheet and then cut with the desired electrical pattern. The cuts go through the stencil stopping at the ceramic green sheet surface. In some embodiments, the stencil is cut on the ceramic green sheet and the cuts extend into the ceramic green sheet at a precisely determined depth.

In FIG. 11, a precise amount of conductive paste with desired properties is dispensed into the stencil pattern using an automated dispenser. This may be done in the same manner as in FIG. 5. The dispenser may be automated with the pattern of the stencil and have a capability to dispense with high precision. The stencil 252 is attached to the top surface of the ceramic green sheet 250 so that is does not move during the application of paste.

The stencil may be attached with an adhesive. The adhesive may be an adhesive backing such as a PSA (pressure sensitive adhesive of acrylic, silicone, etc.). The adhesive may alternatively be a spray, brush-on, or similarly dispensed adhesive that is selectively applied so that the embossed pattern is not affected.

Alternatively, instead of a paste dispenser, the paste can be spread uniformly over the stencil so that it fills the pattern of the stencil. A precise amount of the prescribed paste may be applied over the entire surface of the stencil with enough force to fill all of the openings 254 with paste. A squeegee may be used to press the paste into the openings and remove any excess.

The green sheet with the pattern filled with the conductive material is preferably de-aerated in a vacuum environment to remove any trapped air. After de-aeration, the venting of the vacuum chamber, and ensuing air pressure, ensures that the conducting paste compound is sufficiently leveled and compacted within the pattern so that a dense electrical or thermal element is achieved. This process may be done at ambient and at a sequence of other suitable temperatures.

In FIG. 12, the stencil is carefully removed after suitably drying the paste so that the pattern of the paste 256 on the ceramic 250 is maintained. The patterned sheet may then be routed to the next steps in the production process in the same way as with the patterned paste and ceramic of FIG. 4. This may include compaction of multiple layers, sintering and finishing with machining, polishing etc.

As shown, the structure of FIG. 4 and the structure of FIG. 12 both have a patterned conductive paste over a ceramic sheet. While the top surfaces are different this provides for more flexibility in production so that different structures may be used to suit different purposes. While the examples herein show flat top surfaces for the final top plate, the green body or green sheets may be formed into a non-planar surface to suit non-planar workpieces or to counteract bowing during processing.

In some embodiments, the paste dries to form a continuous line of powder rather than a solid metal. As a result, the line of powder is able to adapt to thermal expansion of the ceramic. Rather than having its own coefficient of thermal expansion that stresses the sintered ceramic, the powder lines move with the ceramic as the ceramic expands and contracts.

The described processes and structures overcome limitations in the precision and repeatability of screen printing processes. The described processes and structures consistently generate required patterns with high fidelity and precision. This results in higher ESC yields, improves delivery cycle time, reduces backlog, and reduces overall cost.

Figure 13:
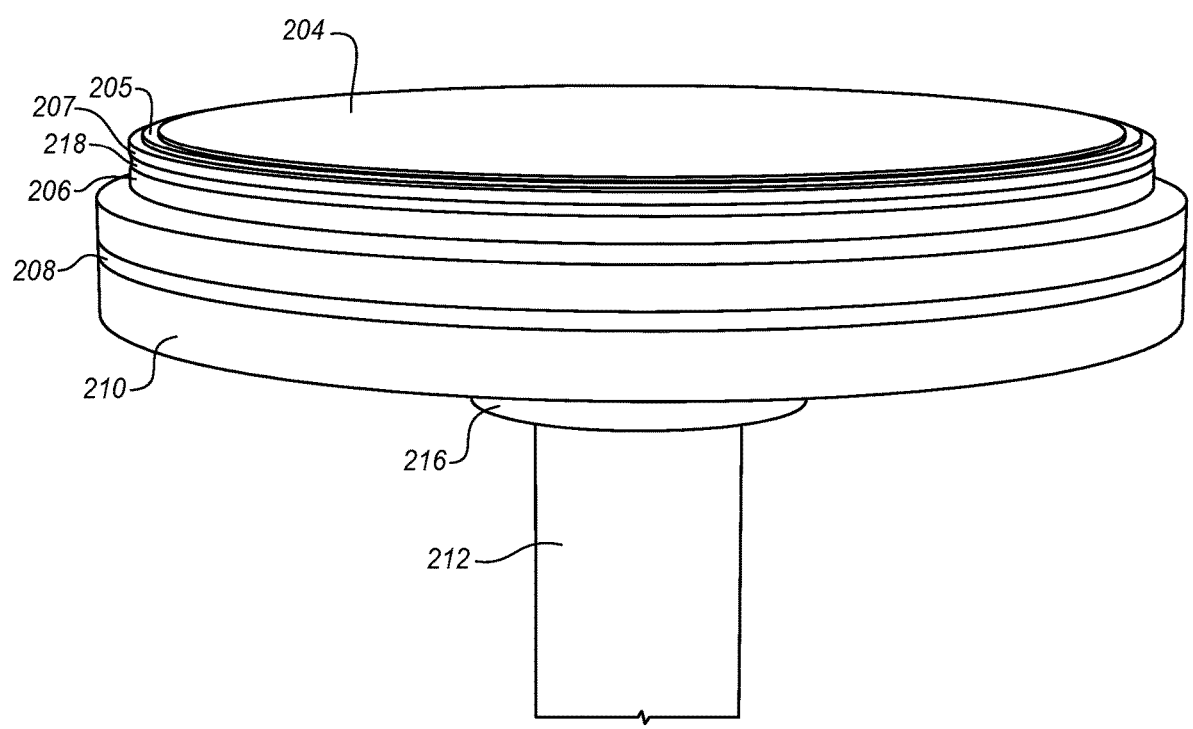
FIG. 13 is an isometric view of a workpiece carrier in accordance with an embodiment of the invention.

FIG. 13 is an isometric view of an assembled electrostatic chuck. A support shaft 212 supports a base plate 210 through an isolator 216. A middle isolator plate 208 and an upper cooling plate 206 are carried by the base plate. The top cooling plate 206 carries a dielectric puck 205 on the top surface of the heater plate. The puck has an upper circular platform to support a workpiece 204 and a lower concentric circular base 207 to attach to the heater plate. The upper platform has internal electrodes to electrostatically attach the workpiece. The internal electrodes may be formed as described herein using a conductive paste between green sheets of the puck.

The workpiece may alternately be clamped, vacuumed or attached in another way. There is an adhesive bond 218 between the puck 215 and the top cooling plate 206 to hold the ceramic of the top plate to the metal of the cooling plate. As described below, heaters may instead be formed in the top plate instead of the middle heater plate. In such an embodiment, the middle plate performs other functions but is no longer the location of the heaters.

The ESC is able to control the temperature of the workpiece using resistive heaters in the puck, coolant fluid in the cooling plate, or both. The resistive heaters may be formed using the conductive paste between ceramic sheets of the puck as described above. Electrical power, coolant, gases, etc. are supplied to the coolant plate 206 and the puck 205 through the support shaft. The ESC may also be manipulated and held in place using the support shaft.

Figure 14:
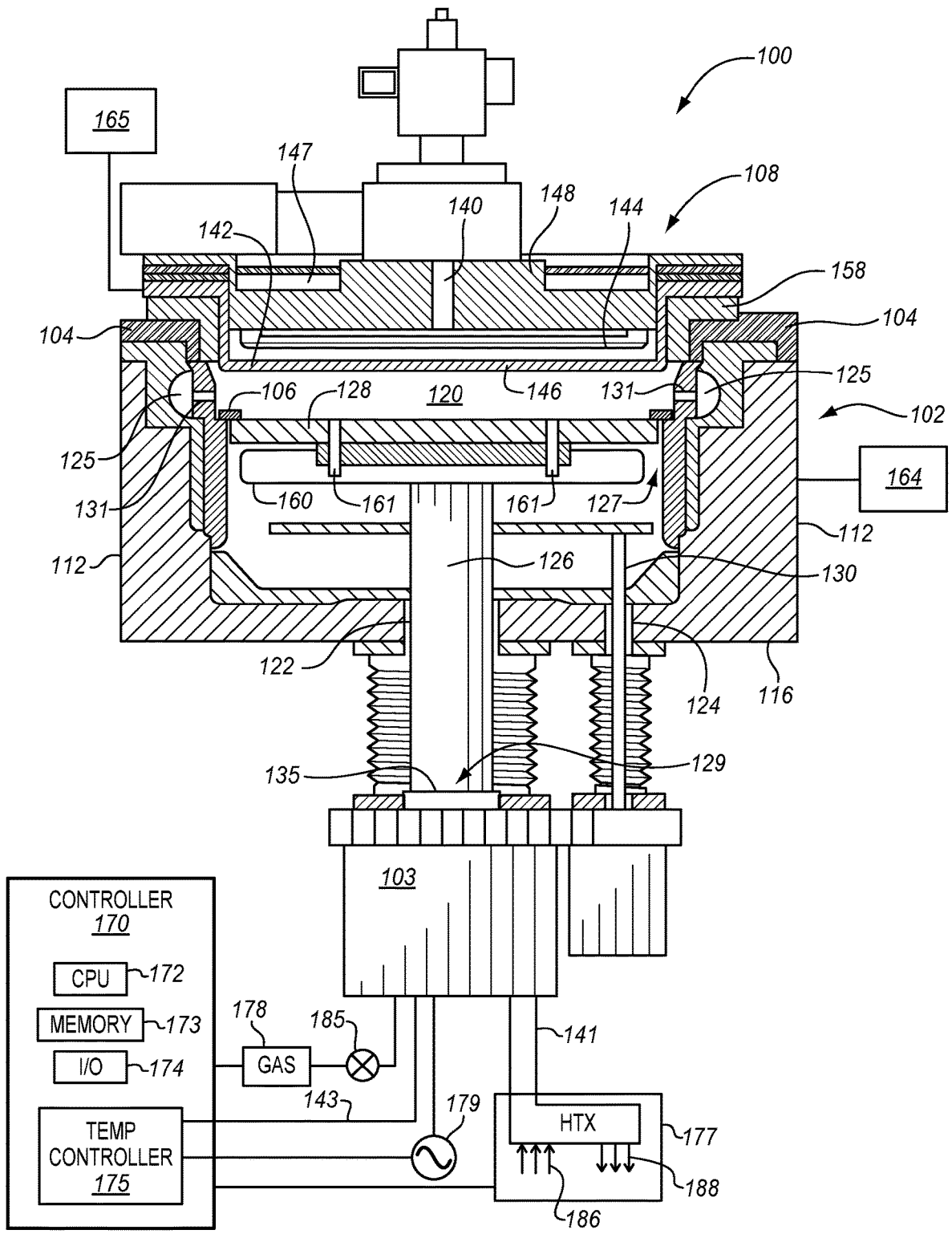
FIG. 14 is a diagram of a plasma etch system including a workpiece carrier in accordance with an embodiment of the present invention.

FIG. 14 is a partial cross sectional view of a plasma system 100 having a pedestal or workpiece carrier 128 according to embodiments described herein. The pedestal 128 has an active cooling system which allows for active control of the temperature of a substrate positioned on the pedestal over a wide temperature range while the substrate is subjected to numerous process and chamber conditions. The plasma system 100 includes a processing chamber body 102 having sidewalls 112 and a bottom wall 116 defining a processing region 120.

A pedestal, carrier, chuck or ESC 128 is disposed in the processing region 120 through a passage 122 formed in the bottom wall 116 in the system 100. The pedestal 128 is adapted to support a substrate (not shown) on its upper surface. The substrate may be any of a variety of different workpieces for the processing applied by the chamber 102 made of any of a variety of different materials. The pedestal 128 may optionally include heating elements (not shown), for example resistive elements, to heat and control the substrate temperature at a desired process temperature. Alternatively, the pedestal 128 may be heated by a remote heating element, such as a lamp assembly.

The pedestal 128 is coupled by a shaft 126 to a power outlet or power box 103, which may include a drive system that controls the elevation and movement of the pedestal 128 within the processing region 120. The shaft 126 also contains electrical power interfaces to provide electrical power to the pedestal 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 and is used to activate substrate lift pins 161 disposed through the pedestal 128. The substrate lift pins 161 lift the workpiece off the pedestal top surface to allow the workpiece to be removed and taken in and out of the chamber, typically using a robot (not shown) through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120. The showerhead assembly 142 includes an annular base plate 148 having a blocker plate 144 disposed intermediate to a faceplate 146.

A radio frequency (RF) source 165 is coupled to the showerhead assembly 142. The RF source 165 powers the showerhead assembly 142 to facilitate generation of plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120 in very close proximity to the sidewalls 112 of the chamber body 102 to prevent exposure of the sidewalls 112 to the processing environment within the processing region 120. The liner assembly 127 includes a circumferential pumping cavity 125 that is coupled to a pumping system 164 configured to exhaust gases and byproducts from the processing region 120 and control the pressure within the processing region 120. A plurality of exhaust ports 131 may be formed on the chamber liner assembly 127. The exhaust ports 131 are configured to allow the flow of gases from the processing region 120 to the circumferential pumping cavity 125 in a manner that promotes processing within the system 100.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller receives a temperature reading 143 from a sensor (not shown) on the pedestal. The temperature sensor may be proximate a coolant channel, proximate the wafer, or placed in the dielectric material of the pedestal. The temperature controller 175 uses the sensed temperature or temperatures to output control signals affecting the rate of heat transfer between the pedestal assembly 142 and a heat source and/or heat sink external to the plasma chamber, such as a heat exchanger 177.

The system may also include a controlled heat transfer fluid loop 141 with flow controlled based on the temperature feedback loop. In the example embodiment, the temperature controller 175 is coupled to a heat exchanger (HTX)/chiller 177. Heat transfer fluid flows through a valve (not shown) at a rate controlled by the valve through the heat transfer fluid loop 141. The valve may be incorporate into the heat exchanger or into a pump inside or outside of the heat exchanger to control the flow rate of the thermal fluid. The heat transfer fluid flows through conduits in the pedestal assembly 142 and then returns to the HTX 177. The temperature of the heat transfer fluid is increased or decreased by the HTX and then the fluid is returned through the loop back to the pedestal assembly.

The HTX includes a heater 186 to heat the heat transfer fluid and thereby heat the substrate. The heater may be formed using resistive coils around a pipe within the heat exchanger or with a heat exchanger in which a heated fluid conducts heat through an exchanger to a conduit containing the thermal fluid. The HTX also includes a cooler 188 which draws heat from the thermal fluid. This may be done using a radiator to dump heat into the ambient air or into a coolant fluid or in any of a variety of other ways. The heater and the cooler may be combined so that a temperature controlled fluid is first heated or cooled and then the heat of the control fluid is exchanged with that of the thermal fluid in the heat transfer fluid loop.

The valve (or other flow control devices) between the HTX 177 and fluid conduits in the pedestal assembly 142 may be controlled by the temperature controller 175 to control a rate of flow of the heat transfer fluid to the fluid loop. The temperature controller 175, the temperature sensor, and the valve may be combined in order to simplify construction and operation. In embodiments, the heat exchanger senses the temperature of the heat transfer fluid after it returns from the fluid conduit and either heats or cools the heat transfer fluid based on the temperature of the fluid and the desired temperature for the operational state of the chamber 102.

Electric heaters (not shown) may also be used in the ESC to apply heat to the workpiece assembly. The electric heaters, typically in the form of resistive elements are coupled to a power supply 179 that is controlled by the temperature control system 175 to energize the heater elements to obtain a desired temperature.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluid such as those containing perfluorinated inert polyethers. While the present description describes the pedestal in the context of a PECVD processing chamber, the pedestal described herein may be used in a variety of different chambers and for a variety of different processes.

A backside gas source 178 such as a pressurized gas supply or a pump and gas reservoir are coupled to the chuck assembly 142 through a mass flow meter 185 or other type of valve. The backside gas may be helium, argon, or any gas that provides heat convection between the wafer and the puck without affecting the processes of the chamber. The gas source pumps gas through a gas outlet of the pedestal assembly described in more detail below to the back side of the wafer under the control of the system controller 170 to which the system is connected.

The processing system 100 may also include other systems, not specifically shown in FIG. 14, such as plasma sources, vacuum pump systems, access doors, micromachining, laser systems, and automated handling systems, inter alia. The illustrated chamber is provided as an example and any of a variety of other chambers may be used with the present invention, depending on the nature of the workpiece and desired processes. The described pedestal and thermal fluid control system may be adapted for use with different physical chambers and processes.

Examples of different embodiments of a workpiece carrier top plate include a top plate with embedded sintered conductive paste dispensed onto ceramic sheets, compacted together, and sintered.

Embodiments include a method for forming a top plate for a workpiece carrier that includes embossing a pattern into a ceramic sheet, applying a conductive paste into a channel embossed into the ceramic sheet and drying the paste.

Embodiments include the method above in which embossing includes pressing a die into the ceramic sheet or, conversely, pressing a ceramic sheet into the die.

Embodiments include the methods above in which the die has vents to allow air to escape from the between the die and the ceramic sheet when embossing.

Embodiments include the methods above in which the embossing is done in ambient or in a vacuum environment.

Embodiments include the methods above in which the die is pretreated with a thin layer of release agent before embossing.

Embodiments include the methods above in which the conductive paste is applied in a pattern corresponding to the embossed channel using an automated paste dispenser.

Embodiments include a method of forming a top plate for a workpiece carrier that includes applying a patterned stencil over a ceramic sheet, applying a conductive paste into openings in the stencil pattern, drying the paste, and removing the stencil.

Embodiments include the methods above in which the stencil is patterned by laser cutting and then attached to the ceramic sheet using a suitable adhesive or with vacuum chucking.

Embodiments include the methods above in which the stencil is patterned after being attached to the ceramic sheet.

Embodiments include the methods above in which the stencil is formed of a polymer or a metal.

Embodiments include the methods above in which the paste is applied by an automated paste dispenser.

Embodiments include the methods above in which the paste is applied over the stencil and then pressed into the openings.

Embodiments include the methods above in which the excess paste is removed from the stencil with a squeegee.

Embodiments include the methods above including multiple embossed channels and in which different types of paste are dispensed into different channels to form different types of electrical components.

Embodiments include the methods above in which the filled paste is de-aerated and compacted into a dense pattern by a vacuum and vent process at ambient or other suitable temperatures.

Embodiments include the methods above in which the ceramic sheet is laminated with other ceramic sheets and sintered to form the top plate.

Embodiments include the methods above in which the top plate is machined and polished after sintering.

Embodiments include means for performing any of the above methods.

Embodiments include a top plate of a workpiece carrier formed by any of the above methods.

What is claimed is:

1. A method of fabricating a workpiece carrier top plate comprising:
    embossing at least one of a plurality of ceramic sheets to form features in the at least one of the plurality of ceramic sheets;
    dispensing conductive paste into the features of the at least one of the plurality of ceramic sheets;
    embedding the paste between the plurality of ceramic sheets;
    compacting ceramic sheets together with the paste; and
    sintering the paste.

2. The method of claim 1, wherein the sintering the paste further comprises sintering the ceramic sheets.

3. The method of claim 1, wherein dispensing the paste comprises spreading the paste and then removing the paste with a squeegee.

4. The method of claim 3, further comprising applying a stencil over a selected one of the ceramic sheets and wherein spreading comprises spreading the paste through the stencil onto the selected ceramic sheet.

5. The method of claim 4, wherein the stencil defines a line pattern of openings so that the paste is applied to the selected ceramic sheet as lines.

6. The method of claim 1, further comprising piercing holes through the ceramic sheets.

7. A workpiece carrier top plate for carrying a semiconductor substrate, the carrier comprising:
    a plurality of ceramic sheets compacted together, the ceramic sheets having embossed features therein;
    sintered conductive paste dispensed into the embossed features of the ceramic sheets and embedded between the ceramic sheets; and
    electrical terminals coupled to the conductive paste to apply an electrical current to the conductive paste.

8. The workpiece carrier top plate of claim 7, wherein the ceramic sheets are sintered.

9. The workpiece carrier top plate of claim 7, wherein the paste is dispensed by spreading and then removing with a squeegee.

10. The workpiece carrier top plate of claim 7, wherein the ceramic sheets have pierced through holes.

11. The workpiece carrier top plate of claim 7, wherein the paste is in the form of electrodes and the electrical terminals allow an electrostatic charge to the electrodes.

12. The workpiece carrier top plate of claim 7, wherein the paste is in the form of resistive heaters and the electrical terminals allow a current to be applied to heat the heaters.

13. A method of forming a top plate for a workpiece carrier comprising:
    embossing a pattern of wells into a ceramic sheet;
    applying a conductive paste into the wells of the ceramic sheet;
    drying the paste; and
    compacting the ceramic sheet with a plurality of other ceramic sheets to form the top plate.

14. The method of claim 13, wherein embossing includes pressing a die into the ceramic sheet or, conversely, pressing a ceramic sheet into the die.

15. The method of claim 13, wherein embossing includes pressing a pin through the ceramic sheet to form a hole.

16. The method of claim 13, wherein embossing includes forming a recess for an electrical part.

17. The method of claim 13, further comprising sintering the paste after drying the paste.

18. The method of claim 13, wherein applying a conductive paste comprises applying a stencil over the ceramic sheet and applying the paste through the ceramic sheet.

* * * * *